Figure 1A:
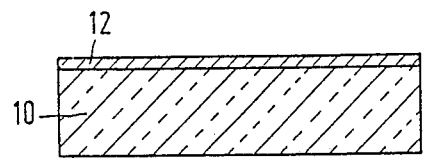

United States Patent [19]

Heijman et al.

[11] Patent Number: 4,957,899
[45] Date of Patent: Sep. 18, 1990

[54] METHOD OF PATTERNING SUPERCONDUCTING OXIDE THIN FILMS

[75] Inventors: Maritza G. J. Heijman; Peter C. Zalm, both of Eindhoven, Netherlands

[73] Assignee: U.S. Philips Corporation, New York, N.Y.

[21] Appl. No.: 292,676

[22] Filed: Jan. 3, 1989

Related U.S. Application Data

[63] Continuation-in-part of Ser. No. 219,519, Jul. 15, 1988, Pat. No. 4,900,709.

[30] Foreign Application Priority Data

Jul. 21, 1987 [NL] Netherlands ................ 8701718

[51] Int. Cl.$^5$ .................... B05D 5/12; B32B 33/00
[52] U.S. Cl. .................................. 505/1; 505/725; 505/730; 505/742; 427/62; 427/63; 427/96; 428/701; 428/702
[58] Field of Search .............. 505/1, 818, 820, 730, 505/725; 427/62, 63, 43.1, 96

[56] References Cited

U.S. PATENT DOCUMENTS 4,255,474  3/1981  Smith, Jr. .................... 428/46
4,290,843  9/1981  Korenstein et al. ............ 156/628
4,316,785  2/1982  Suzuki et al. ................ 204/192 X Primary Examiner—Norman Morgenstern
Assistant Examiner—Roy V. King
Attorney, Agent, or Firm—Norman N. Spain

[57] ABSTRACT

A method is shown of applying in accordance with a pattern thin layers of an oxidic superconductive material onto a substrate in which a copper oxidic based material that after heating is rendered superconducting at a desired service temperature is covered in a desired pattern with a composition that renders the underlying oxidic material non-superconducting.

3 Claims, 2 Drawing Sheets

METHOD OF PATTERNING SUPERCONDUCTING OXIDE THIN FILMS

This is a continuation-in-part of application Ser. No. 219,510, filed July 15, 1988, now U. S. Pat. No. 4,900,709.

The invention relates to a method of applying thin layers of oxidic superconductive material onto a substrate.

A method of applying thin layers of superconductive $(La_{1-x}Sr_x)_2CuO_4$ (wherein $x\cong 0.03$) onto a strontium titanate substrate by means of magnetron sputtering is described in an article by M.Suzuki and T.Murakami in the Japanese Journal of Applied Physics, Vol. 26 (4), pages L524–L525 (1987).

For the use of superconductive materials in thin layers it is often desirable to have the possibility to apply the superconductive material in an accurately defined pattern, with, details as fine as possible, for example for use in semiconductor devices and sensors. Oxidic superconductive materials of the said type oz of the group of which $YBa_2Cu_3O_{7-\delta}$ (wherein $\delta\cong 0.3$) is a representative, have the property that they have a poor resistance against moisture, Which is a disadvantageous property for the above purpose. The customary manner of producing patterned thin layers, in which first a thin layer is applied across the entire surface, whereafter this layer is formed in the desired pattern by means of a mask and by etching, is consequently not very suitable.

The invention has for its object to provide a method of applying thin layers of oxidic superconductive material in a pattern on a substrate, it not being necessary to subject the superconductive material after application to mechanical or chemical treatments.

According to the invention, this object is accomplished by a method in which the oxidic material is applied onto a substrate which, in accordance with a desired pattern, has at least two different material compositions at its surface, a first composition being chosen such that the oxidic material applied thereon is superconductive at a desired service temperature and a second composition being chosen such that the same oxidic material applied thereon is not superconductive at said service temperature.

Applying the oxidic material can be effected in accordance with different suitable methods, for example by means of sputtering, magnetron sputtering, chemical vapour deposition or vacuum coating.

In an embodiment of the method according to the invention the different material compositions at the surface are obtained by providing a substrate of the first composition with a thin layer of the second composition in accordance with a pattern. In that case the superconductive pattern constitutes the complement (negative image) of the patterned thin layer.

In a further embodiment of the method according to the invention, the different material compositions at the surface are obtained by providing a substrate of the second composition with a thin layer of the first composition in accordance with a pattern. In this case the superconductive pattern forms a positive image of the patterned thin layer.

Appropriate materials onto which the oxidic materials in superconductive form can be applied are strontium titanate and noble metals, preferably silver and gold.

Appropriate materials onto which the same oxidic materials in the non-superconductive form can be applied are silicon and aluminum oxide. A specific advantage of this choice of material is that therewith known methods from the field of manufacturing semiconductor devices can be used.

U.S. Pat. No. 4,255,474 discloses a method in which a thin layer of transparent material is modified in accordance with a pattern by means of diffusion of a previously applied material in accordance with a pattern. In the method of the invention a diffusion stage is not necessary, but the structure and/or composition on deposition is influenced by the substrate in such a manner that, depending on the local composition of that substrate, material is formed which is superconductive or not superconductive, as the case may be.

U.S. Pat. No. 4,290,843 discloses a method in which a crystalline substrate is locally disturbed by means of implantation, whereafter an epitaxial mono-crystalline layer is grown on the non-disturbed portions of the crystal surface. Simultaneously a polycrystalline layer, which is removed afterwards, is grown on the disturbed surface. The layers manufactured in accordance with the invention are not mono-crystalline, so that on applying the thin layer such a high degree of dependence on the composition and structure of the substrate is not obvious.

An alternative embodiment of the method of the invention for applying thin layers of oxidic, superconductive material on a substrate, a thin layer of an oxidic material being applied onto a substrate and being treated at elevated temperature such that it is superconductive at a desired service temperature, is effected in the reverse sequence. To that end, the oxidic material is coated, prior to treatment at elevated temperature, in accordance with a desired pattern, with a thin layer of a second composition which is chosen such that the subjacent material is not superconductive at said service temperature.

Strontium titanate is, for example, used as the substrate. During the thermal treatment, recrystallisation occurring, that portion of the oxidic material that contacts, for example, silicon or aluminum oxide is brought to such a state that it does not exhibit superconductive behaviour at the desired service temperature.

Figure 2A:
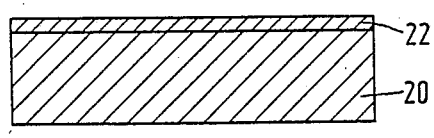
Figure 2B:
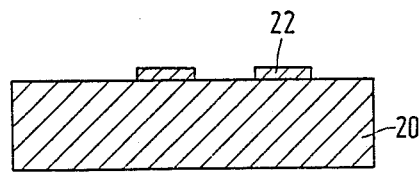
Figure 2C:
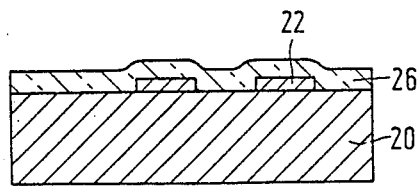
Figure 3:
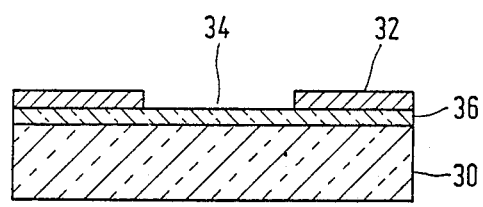

The invention will now be described by way of example with reference to embodiments and an accompanying drawing, in which FIG. 1 a–c schematically illustrate a number of steps of an embodiment of the method according to the invention in which a negative image is formed, FIG. 2 a–c schematically illustrate a number of steps of an embodiment in accordance with the method of the invention in which a positive image is formed, and in which FIG. 3 schematically illustrates an alternative embodiment of the invention.

Embodiment 1

Figure 1B:
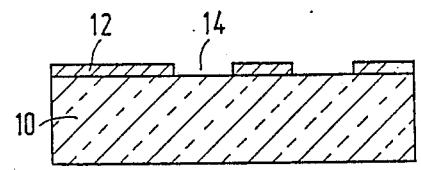
Figure 1C:
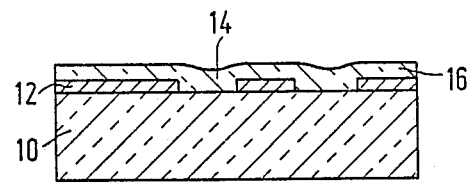

FIG. 1a shows a substrate 10 of $SrTiO_3$ which is coated with a silicon layer 12. Instead of silicon it is alternatively possible to use a layer of aluminum oxide. Apertures 14 are made in the silicon layer, so that the substrate material is locally laid bare, see FIG. 1b. This can be effected in any suitable manner, for example by coating the silicon layer with a photoresist, expose this resist to light via a mask and to develop it thereafter, followed by local removal of the silicon layer in an etching procedure.

Thereafter a layer of oxidic material 16 of the composition $YBa_2Cu_3O_{6.7}$ is applied, for example by means of vacuum deposition, the substrate being kept at a temperature of 850° C. In the region of the apertures 14 the applied layer is superconductive at a temperature of approximately 90 K, in the region of the silicon layer 12 the applied layer is not superconductive at that temperature.

If so desired the layer 16 can further be coated with a protective layer to limit ambient influences to a minimum.

Substitutions can be effected in known manner in the said superconductive material without affecting the efficiency of the method of the invention. Thus, Y can be replaced, for example, wholly or partly by rare earth metal ions, Ba can be replaced by Sr or Ca, and O can partly be replaced by F.

Instead of by vapour deposition, the layer 16 can, for example, alternatively be applied by means of sputter deposition, using a pressed target plate of the desired composition. The substrate can be kept at a high temperature, for example from 800° to 900° C., but it is alternatively possible to effect deposition at a lower temperature. In that case a post-treatment is required, to obtain superconducting properties.

In a suitable embodiment of the invention, deposition is achieved by dc triode sputtering with a voltage of 1 kV in Ar at a pressure of about 1 Pa. The material is converted to a superconductive material by a thermal treatment at 800° to 900° C. in air for 4 hours.

Embodiment 2

FIG. 2a shows a substrate 20 of silicon coated with a silver layer 22. Instead of silver a layer of gold or a layer of strontium titanate can, for example, alternatively be used. Apertures are made in the silver layer so that a pattern of silver conductors remains, see FIG. 2b, for example in the manner described in the preceding embodiment.

Thereafter a layer of oxidic material 26 is applied, for example in the manner described in the preceding embodiment and having the composition specified therein. On the sites of the silver conductors 22 the oxidic material is superconductive, in those places where the oxidic material is applied directly to the silicon substrate there is no superconductive behaviour.

The invention provides a simple manner for applying superconductive oxidic materials, in the form of a pattern, the definition of the pattern being effected before the superconductive material is applied. In this situation the phenomenon is utilised that a small disturbance of the composition and/or structure of the oxidic material is sufficient to ensure that the material is not superconductive at the desired temperature.

Embodiment 3

FIG. 3 shows a substrate 30 of strontium titanate coated with a layer of oxidic material 36 of the composition $YBA_2Cu_3O_{6.7}$, see embodiment 1. On top of this, an aluminum oxide layer 32 is provided with apertures 34. After a thermal treatment of the assembly, at 800° to 900° C. in air for 4 hours, layer 36 is superconductive at 80 K at the location of the apertures 34, but it is not superconductive at the location of the structured aluminum oxide layer 32.

We claim:

1. A method of forming a patterned copper oxide based superconductor on a substrate operable at a particular service temperature comprising providing a coating of a copper oxide based material on the substrate and then applying a thin layer of a composition on to the surface of the copper oxide based coating with a desired pattern, said composition is selected such that the copper oxide based material underlying said composition is rendered to be non-superconducting while the exposed copper oxide based material is rendered to be superconducting at the desired service temperature.

2. A method as claimed in claim 1, characterized in that the composition applied to the copper oxide based material is silicon.

3. A method as claimed in claim 1, characterized in that the composition applied to the copper oxide based material is aluminum oxide.

* * * * *